(12) United States Patent
Mahler

(10) Patent No.: US 9,082,706 B2
(45) Date of Patent: Jul. 14, 2015

(54) SEMICONDUCTOR DEVICE WITH A SEMICONDUCTOR CHIP AND ELECTRICAL CONNECTING ELEMENTS TO A CONDUCTOR STRUCTURE

(75) Inventor: Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 1401 days.

(21) Appl. No.: 11/571,667

(22) PCT Filed: Jul. 4, 2005

(86) PCT No.: PCT/DE2005/001172
§ 371 (c)(1),
(2), (4) Date: Nov. 26, 2007

(87) PCT Pub. No.: WO2006/005304
PCT Pub. Date: Jan. 19, 2006

(65) Prior Publication Data
US 2008/0265440 A1    Oct. 30, 2008

(30) Foreign Application Priority Data

Jul. 5, 2004 (DE) .......................... 10 2004 032 605

(51) Int. Cl.
 *H01L 23/00* (2006.01)
 *H01L 23/31* (2006.01)
 *H01L 23/495* (2006.01)

(52) U.S. Cl.
 CPC ............ *H01L 24/29* (2013.01); *H01L 23/3128* (2013.01); *H01L 23/3142* (2013.01); *H01L 23/49513* (2013.01); *H01L 23/49586* (2013.01); *H01L 24/32* (2013.01); *H01L 24/48* (2013.01); *H01L 24/81* (2013.01); *H01L 2224/16225* (2013.01); *H01L 2224/32245* (2013.01); *H01L 2224/48091* (2013.01); *H01L 2224/48247* (2013.01); *H01L 2224/48472* (2013.01); *H01L 2224/73265* (2013.01); *H01L 2224/81801* (2013.01); *H01L 2224/83192* (2013.01); *H01L 2224/92247* (2013.01); *H01L 2924/01004* (2013.01); *H01L 2924/01005* (2013.01);
(Continued)

(58) Field of Classification Search
USPC ................... 257/783, E21.503; 438/118, 119
See application file for complete search history.

(56) References Cited

U.S. PATENT DOCUMENTS 5,122,858 A    6/1992    Mahulikar et al.
6,107,690 A    8/2000    Courtenay et al.
(Continued)

FOREIGN PATENT DOCUMENTS

EP    1273630    1/2003
JP    60094744    5/1985
JP    01234712    9/1989
WO    2005071741    8/2005

*Primary Examiner* — Yu-Hsi D Sun
(74) *Attorney, Agent, or Firm* — Dicke, Billig & Czaja, PLLC

(57) ABSTRACT

A semiconductor device with a semiconductor chip and electrical connecting elements to a conductor structure, and a method for producing the same is disclosed. In one embodiment, the conductor structure has a chip island and contact terminal areas. These are arranged in a coplanar manner in relation to each other. The semi-conductor structure is selectively coated by a filled plastic film. Both the semiconductor chip and the electrical connecting elements are mechanically fixed and electrically connected by means of the film-covered chip island and the film-covered contact terminal areas, respectively.

5 Claims, 4 Drawing Sheets

(52) U.S. Cl.
CPC ............... *H01L2924/01006* (2013.01); *H01L 2924/01013* (2013.01); *H01L 2924/01029* (2013.01); *H01L 2924/01032* (2013.01); *H01L 2924/01033* (2013.01); *H01L 2924/01046* (2013.01); *H01L 2924/01047* (2013.01); *H01L 2924/01068* (2013.01); *H01L 2924/01079* (2013.01); *H01L 2924/01082* (2013.01); *H01L 2924/01322* (2013.01); *H01L 2924/078* (2013.01); *H01L 2924/14* (2013.01); *H01L 2924/15311* (2013.01)

(56) References Cited

U.S. PATENT DOCUMENTS

| | | | |
|---|---|---|---|
| 6,137,183 | A | 10/2000 | Sako |
| 6,166,433 | A * | 12/2000 | Takashima et al. ............ 257/702 |
| 6,340,793 | B1 * | 1/2002 | Yaguchi et al. ................ 174/539 |
| 6,384,472 | B1 * | 5/2002 | Huang ............................ 257/680 |
| 6,469,086 | B1 * | 10/2002 | Neu et al. ........................ 524/404 |
| 2002/0140095 | A1 | 10/2002 | Funakura et al. |
| 2003/0211677 | A1 | 11/2003 | Reeder et al. |
| 2004/0106233 | A1 | 6/2004 | Lin et al. |

* cited by examiner

SEMICONDUCTOR DEVICE WITH A SEMICONDUCTOR CHIP AND ELECTRICAL CONNECTING ELEMENTS TO A CONDUCTOR STRUCTURE

CROSS REFERENCE TO RELATED APPLICATION

This Utility Patent Application claims the benefit of the filing date of German Application No. DE 10 2004 032 605.3, filed Jul. 5, 2004, and International Application No. PCT/DE2005/001172, filed Jul. 4, 2005, both of which are herein incorporated by reference.

BACKGROUND

The invention relates to an integrated circuit, a semiconductor device with a semiconductor chip and electrical connecting elements to a conductor structure.

A still unsolved problem with such semiconductor devices is that of connecting the chip to the conductor structure, especially if it is desired to avoid expensive eutectic soldered connections with a gold coating on a chip island of a conductor structure of a support material. A further problem is the anchorage of the plastic molding compound on such a structure. And finally, the dissipation of the heat from the power loss of the semiconductor chip embedded in the plastic molding compound by way of the chip island is always a constant technical challenge and the cause of malfunctions and reduced reliability of the semiconductor devices produced from a large number of different materials.

For the aforementioned three problem areas, associated with the attachment of a semiconductor chip on a conductor structure, three different components are used in the prior art, namely 1. a special material component, associated with special methods of chip connection on a chip island on a conductor structure of a leadframe;

2. a special adhesion-promoting and electrodeposited coating on the conductor structure and, if the semiconductor chip is already mounted, on the remaining conductor structure for anchoring a plastic package molding compound on the conductor structure of a support material of a leadframe; and 3. provision of an additional heat sink connected to the chip island or the conductor structure for dissipating the lost heat.

The adhesion-promoting coating is carried out either before the attachment of the semiconductor chip on the chip support, which requires a large number of clearances in the adhesion-promoting coating for the semiconductor chip and the electrical connections to the semiconductor chip that are to be provided, so that "complete" coverage cannot be realized with an anchorage coating, especially since tolerance regions around the semiconductor chip on the chip island and around the connecting regions for the connecting elements must not be coated.

Application of the adhesion-promoting coating after mounting of the semiconductor chip on the chip island and after wiring of the semiconductor chip to the conductor structure of the leadframe similarly does not provide a "complete" anchorage layer, especially since the electrodeposited adhesion promoters do not adhere to plastic surfaces and/or ceramic surfaces.

The provision of bonding connections between the semiconductor chip and the conductor structure of a leadframe likewise requires complex techniques for the preparation of the surface regions to be bonded of the conductor structure, so that there is a need for a simplified system that dispenses with these different methods and components.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a schematic cross section through a partial region of a leadframe with an applied filled plastic film;

FIG. 4 illustrates a schematic cross section through the partial region of the leadframe according to FIG. 3 after pre-adjustment of a semiconductor chip with respect to a chip island of the leadframe;

FIG. 5 illustrates a schematic cross section through the partial region of the leadframe according to FIG. 4 after pressing the semiconductor chip into the highly viscous, filled coating of the chip island;

FIG. 6 illustrates a schematic cross section through the partial region of the leadframe according to FIG. 5 after applying electrical connecting elements between the semiconductor chip and the conductor structure;

FIG. 7 illustrates a schematic cross section through the partial region of the leadframe according to FIG. 6 after packaging the semiconductor device components in a plastic package molding compound;

DETAILED DESCRIPTION

Figure 1:
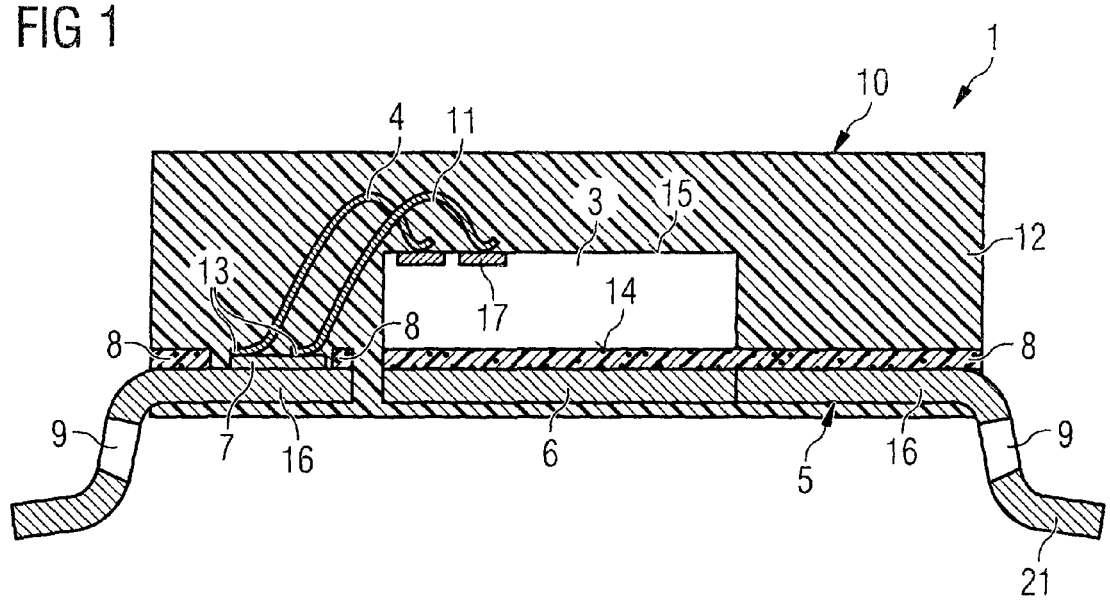
FIG. 1 illustrates a schematic cross section through a semiconductor device of a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a semiconductor device which requires fewer components and simplifies the attachment of semiconductor chips and connecting elements on a conductor structure of a leadframe. Furthermore, one embodiment of the invention both improves the thermal and electrical connection of a semiconductor chip onto the conductor structure and simplifies the electrical connection of connecting elements.

According to the invention, a semiconductor device with a semiconductor chip and electrical connecting elements to a conductor structure is provided. The conductor structure has a chip island and contact terminal areas. These are arranged in a coplanar manner. In this case, the conductor structure is selectively coated by a filled plastic film. Both the semiconductor chip and the electrical connecting elements are mechanically fixed and/or electrically connected by means of the film-covered chip island and the film-covered contact terminals, respectively, the film coverage at the same time representing an adhesion-promoting coating with respect to a surrounding plastic package molding compound.

This semiconductor device has the advantage that the aforementioned problems are solved by a single completely covering electrically conductive or alternatively electrically insulating but thermally highly conductive organic layer. This organic layer of a filled plastic film serves as a chip attachment material. Furthermore, the filled plastic film as a coating of the conductor structure improves the adhesive strength of the plastic molding compound. Finally, the layer in the form of the filled plastic film serves for removing the heat produced during operation, allowing it also to be used for plastic substrates and ceramic substrates on which the conductor structure may be arranged. It thereby overcomes the aforementioned problem of inadequate coverage in the case of different chip sizes, on account of the tolerances that have to be maintained for adhesion-promoting coatings in order to permit wire bonding on the contact terminal areas.

In addition, the semiconductor device has the advantage that the film filled with particles has a corrosion-inhibiting effect with respect to metallic surfaces of the conductor structure, and consequently stabilizes the metallic surfaces of the conductor structure. The selective coating of the conductor structure with the filled plastic film may be performed by choosing a suitable process. For example, the filled plastic film may first be applied over the full surface area, followed by selective stripping by solvents, laser ablation or by means of mechanical removal with prior selective masking of the full-area coating. In this connection, a filled plastic film is also understood as meaning a filled adhesive film or other adhesive organic coatings on the conductor structure.

Depending on requirements, this filled coating or filled adhesive film may be made to be electrically conductive or electrically insulating. In this semiconductor device, the chip is reliably attached by a combined pressure-temperature method on an initially not yet completely cured or reacted layer produced by the filled film. This temporary state of incomplete curing or incomplete crosslinkage of the layer produced by the filled plastic film also leads to a clear improvement in adhesion with respect to the plastic molding compound to be applied to the conductor structure or a leadframe.

For this purpose, the plastic adhesive film is applied to the substrate support and then either pre-reacted by the chip attaching process and then subsequently completely cured together with a molding process, or made to melt at the surface during the molding process and consequently undergo intensive anchorage or crosslinkage with the package molding compound. This semiconductor device construction is particularly suitable for semiconductor modules in which a number of semiconductor chips are to be attached on a conductor structure in a single process step.

In one embodiment of the invention, the filled plastic film has insulating particles as filler material for mechanical fixing and for thermal coupling, both of the semiconductor chip and of the surrounding plastic package molding compound. Such insulating particles are ceramic particles and the known ceramic particles include in particular aluminum nitrite, aluminum oxide, silicon nitride, silicon carbide, diamond and/or boron nitrite, on account of their high thermal conductivity together at the same time with electrical insulation.

For a conductive connection between the semiconductor chip and the conductor structure, and between bonding wire ends and contact terminal areas of the conductor structure, the plastic film has as the filler conductive metal particles, from the group including aluminum, copper, silver, gold, palladium, nickel or alloys of the same. A plastic film filled with such metal particles has the advantage that it is not only electrically conductive but at the same time enters into intensive crosslinkage with the plastic molding compound during the molding process, and finally can dissipate lost heat on account of the high thermal conductivity of the metal particles.

In a further embodiment of the invention, the semiconductor chips are integrally fixed on chip islands by way of the plastic film with a wiring substrate of a BGA or LGA package. In this case, the conductor structure is applied to the wiring substrate as a thin metal coating, while the external contacts of the semiconductor device are arranged on the underside of the wiring substrate in the form of solder balls. This embodiment of the invention additionally has the advantage that the wiring substrate has a completely planar conductor structure, to which the filled plastic film can be applied without any problems.

In another embodiment, the semiconductor chips are integrally fixed on chip islands by way of the filled plastic film with leads of a package by the leadframe technique. In the case of this leadframe technique, however, it must be ensured that the leadframe has a planar surface, at least in the region of the chip island and the contact terminal areas. In that case, the filled plastic film can be selectively applied in an advantageous way to the entire coplanar region of the conductor structure.

In a further embodiment of the invention, the connecting elements are flip-chip contacts. These flip-chip contacts may be connected to contact terminal areas of a wiring structure by way of the electrically conducting plastic film. In this case, the electrically conducting plastic film is applied to the contact terminal areas of the wiring structure in regions that are separate from one another, so that a connection to the wiring structure of a support substrate can be established by simply pressing the flip-chip contacts into the electrically conductive regions of the plastic film in the highly viscous state. In this case, the support substrate may be an insulating ceramic sheet or an insulating plastic sheet coated with a structured metal layer as a wiring structure. In this case, the contact terminal areas are connected to external contacts of a semiconductor device with an internal flip chip by way of contact vias through the insulating support substrate.

In a further embodiment of the invention, the connecting elements are bonding wires, which are connected to contact terminal areas of a conductor structure by way of separate subregions of an electrically conducting plastic film, in that the bonding wire ends are pressed into the highly viscous plastic film compound. This has the advantage that, after appropriate alignment, a multiplicity of bonding wire ends can be introduced into the electrically conducting plastic film on the contact terminal areas in a simple way by means of a die. Furthermore, these connections can be subjected to loading with a higher current density, since the contacting area between the bonding ends and the electrically conducting plastic film turns out to be much larger and more intensive than in the case of the conventional bonding technique.

A method for producing a semiconductor device from device components with a semiconductor chip and electrical connecting elements to a conductor structure has the following method processes. Firstly, a conductor structure with a chip island and contact terminal areas is produced, the chip island and the contact terminal areas being arranged in a coplanar manner. Subsequently, the conductor structure is covered with a plastic film filled with particles, with the plastic film being structured, congruently in relation to the conducting structure. This produces a filled plastic film or a filled coating on the conductor structure, simultaneously replacing a number of functions of different components of conventional technologies.

After applying the filled plastic film, it is pre-heated, with pre-crosslinking of the polymer molecule chains of the filled plastic film to form a highly viscous coating, covering the conductor structure. At least one semiconductor chip and connecting elements are applied to this coating, the semiconductor chip being applied in regions of a chip island of the conductor structure and the connecting elements being applied in regions of contact terminal areas. Subsequently, the highly viscous compound can cool down, the semiconductor chip and the connecting elements being fixed and/or electrically connected, to be precise on the chip island and the contact terminal areas, respectively. After that, packaging of the device components in a plastic package molding compound can be carried out, with crosslinking of the plastic package molding compound with the filled plastic film on the conductor structure and with curing of the filled plastic film.

This method has the advantage that a large number of method processes in the conventional production of semiconductor devices, in particular in the conventional fixing of semiconductor chips on semiconductor islands or of connecting elements on contact terminal areas of a conductor structure, can be replaced by a small number of method processes. In addition, the method has the advantage that the production times for semiconductor devices can be shortened. Finally, the method has the advantage that connecting of the semiconductor chip or the connecting elements on the conductor structure can be performed more reliably than in the case of conventional production methods for semiconductor devices.

In a way of carrying out the method, the pre-heating is carried out at 130° C. to 180° C., while pre-crosslinking the polymer molecule chains of the filled plastic film to form a highly viscous coating, covering the conductor structure. This is a temperature range in which the plastic of the plastic film is not completely crosslinked and an adequate time period is available to end the crosslinkage in a highly viscous state of the plastic film. In this state, the connecting elements can be subsequently applied to the conductor structure by for example pressing flip-chip contacts into the highly viscous compound of the film material filled with conducting particles on corresponding contact areas of the conductor structure. However, this can only be carried out if the semiconductor chip is based on the flip-chip technique. With this way of carrying out the invention, attachment of the semiconductor chip on a semiconductor chip island is no longer required.

In a further way of carrying out the method according to the invention, it is provided that the application of connecting elements to the conductor structure is performed by pressing bonding wire ends into the highly viscous compound of the film material filled with conducting particles on contact terminal areas of the conductor structure. It is presumed in this case that there is a semiconductor chip that has on its active upper side contact terminal areas already provided with a bonding wire, and that the free ends of the bonding wires are available, to allow them to be pressed into the filled plastic film in the highly viscous state of the film.

In a further way of carrying out the method, it is provided that the crosslinking of the plastic film with the plastic package molding compound is carried out in a temperature range between 160° C. and 200° C. This increased temperature range corresponds to the processing temperature of the plastic package molding compound, the regions near the surface of the filled plastic film at the same time being transformed into a highly viscous state, whereby intensive crosslinking with the plastic package molding compound becomes possible.

In a further way of carrying out the method, the plastic film is still crosslinked and cured at an increased temperature after applying the plastic package molding compound. This increased temperature lies in the temperature range for applying the plastic package molding compound or slightly below it. This subsequent curing has the advantage that the service life and reliability of the semiconductor device is further increased.

FIG. 1 illustrates a schematic cross section through a semiconductor device 1 of a first embodiment of the invention. The designation 3 identifies a semiconductor chip which is fixed with its back side 14 on a chip island 6 of a conductor structure 5 by way of a filled plastic film 8 and is electrically connected to the chip island 6 on account of the conducting metal particles of the filled plastic film 8. This chip island 6 is part of an internal lead 16, which goes over into a lead 9, which is accessible from outside the package 10.

The plastic film 8 filled with conducting particles covers not only the region of the chip island 6 but also the region of the internal lead 16. Furthermore, the filled plastic film 8 is arranged on the conductor structure 5, the contact terminal areas 7 going over by way of internal lead 16 into corresponding leads 9 on the outside of the semiconductor device 1. The contact terminal areas 7 of the internal leads 16 are connected to contact areas 17 on the active upper side 15 of the semiconductor chip 3 by way of electrical connecting elements 4. In this embodiment of the invention, these connecting elements 4 include bonding wires 11.

While the bonding wires 11 are bonded on the upper side 15 of the semiconductor chip 1, on the corresponding contact areas 17, the bonding wires 11 are bonded with their free ends 13 on the corresponding contact terminal areas 7, which are free of the filled plastic film 8. Before the bonding of the bonding wires 11, the semiconductor chip 3 is pressed into the highly viscous compound of the filled plastic film 8 at a temperature between 130° C. and 180° C.

The internal leads 16 are arranged in a coplanar manner with the contact terminal areas 7 and the chip island 6, so that they span a surface area on which the filled plastic film 8 can be arranged without any problem. In order to connect this filled plastic film 8 to the upper sides of the conductor structure 5, the conductor structure 5 and the plastic film 8 are pre-heated in the range between 130° C. and 180° C., the polymer molecule chains of the filled plastic film 8 undergoing pre-crosslinkage to form a highly viscous coating, covering the conductor structure 5. For this purpose, it is provided that the entire upper side of the conductor structure 5 is covered with the filled plastic film 8, while leaving the contact terminal areas 7 free, especially since this film has the property that it bonds with the plastic package molding compound 12 during the molding operation, which is carried out at 160° C. to 200° C., so as to create a reliable anchorage of the plastic package molding compound 12 where it is arranged in the region of the conductor structure 5.

Figure 2:
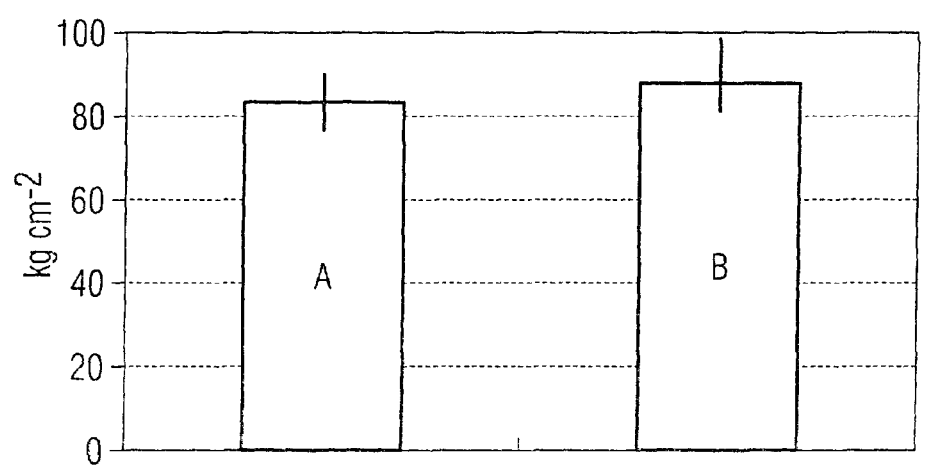
FIG. 2 illustrates a schematic representation of the adhesive strengths based on an adherend surface area in square centimeters with reference to a semiconductor chip of a plastic film filled with conducting particles in comparison with a plastic film filled with ceramic particles.

FIG. 2 illustrates a schematic representation of the adhesive strengths A and B, based on an adherend surface area in square centimeters, with reference to a semiconductor chip of a plastic film filled with conducting particles (A) in comparison with a plastic film filled with ceramic particles (B). This test was measured after a molding process at 175° C. for 90 seconds and post-curing of the molded device at 180° C. for four hours, once the molded plastic package molding compound had been etched away from the semiconductor device to be tested. To establish the adhesive strengths in kg/cm$^2$ between the semiconductor chip on the filled plastic film in the chip island region, the force in kg was exerted on the semiconductor chip laterally in the shearing direction. The area of contact between the back side of the semiconductor chip and the filled plastic film was used for standardizing the adhesive strength. In the result, the materials A and B of the plastic films with electrical particles on the one hand and insulating particles on the other hand do not differ much from each other. However, it is crucial that these investigations are carried out with the same level of filler. The level of filler may be set between 30 and 80% by volume and in this test lies at 50% by volume as a proportion of particles in the plastic molding compound of the plastic film.

FIGS. 3 to 7 illustrate schematic cross sections through semiconductor device components in the production of a semiconductor device of a second embodiment of the invention.

Figure 3:
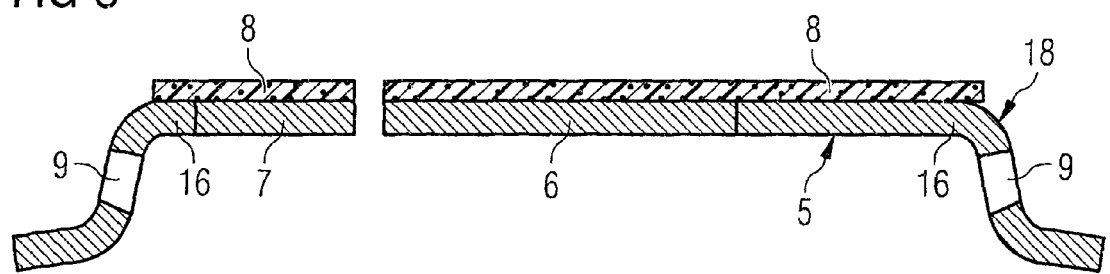
FIGS. 3 to 7 illustrate schematic cross sections through semiconductor device components in the production of a semiconductor device of a second embodiment of the invention.

FIG. 3 illustrates a schematic cross section through a partial region of a leadframe 18 with an applied filled plastic film 8. For this purpose, the partial region of the leadframe 18 has at least one contact terminal area 7 and a chip island 6, which belong to a conductor structure 5 which is aligned in a coplanar manner in the region of the contact area 7 and the chip island 6. In this case, the internal lead 16, the contact areas 7 and the chip island 6 are aligned in a coplanar manner and completely covered by a correspondingly arranged filled plastic film 8. In this embodiment of the invention, the plastic film 8 is filled to as much as 80% by volume with metal particles, in order to realize high conductivity.

Figure 4:
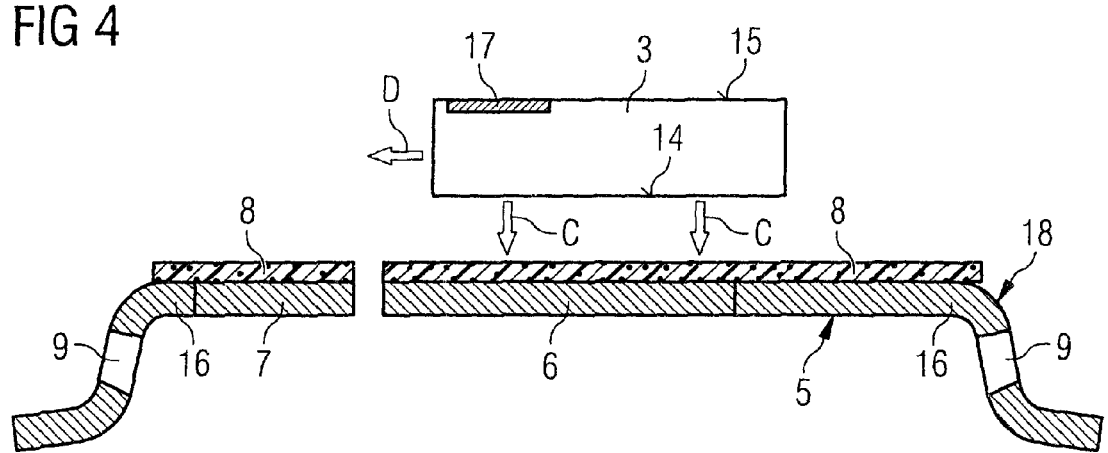

FIG. 4 illustrates a schematic cross section through the partial region of the leadframe 18 according to FIG. 3 after pre-adjustment of a semiconductor chip 3 with respect to a chip island 6 of the leadframe 18. For this purpose, the semiconductor chip 3 is not only flipped but also displaced in the direction of the arrow D before it is pressed onto the pre-heated filled plastic film 8 in the direction of the arrow C. In this embodiment of the invention, this pre-heating was carried out at 130° C., the plastic film 8 being transformed into a highly viscous coating of the internal conductors 16, the chip island 6 and the contact area 7.

Figure 5:
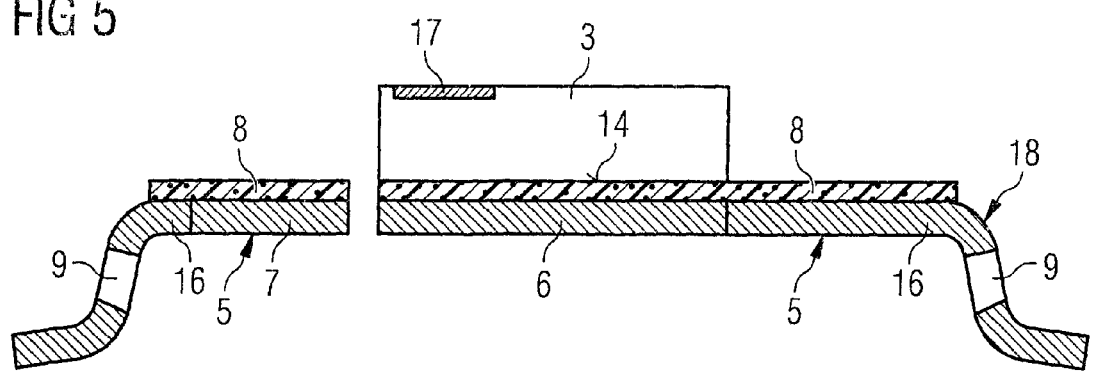

FIG. 5 illustrates a schematic cross section through the partial region of the leadframe 18 according to FIG. 4 after pressing the semiconductor chip 3 into the highly viscous, filled coating 8 of the chip island 6. After this arrangement illustrated in FIG. 5 has cooled down to room temperature, the semiconductor chip is fixed on the chip island 6 by way of the filled plastic coating, so that bonding connections can then be introduced in a next step.

Figure 6:
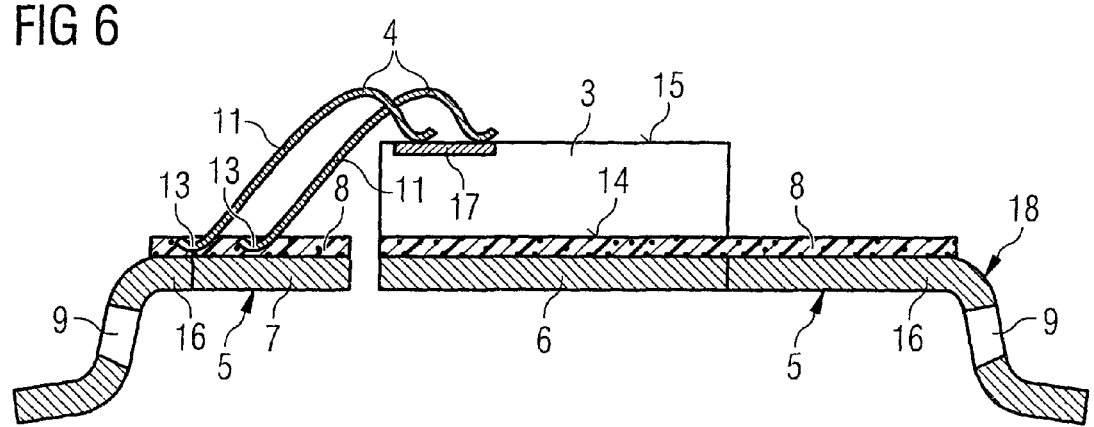

FIG. 6 illustrates a schematic cross section through the partial region of the leadframe 18 according to FIG. 5 after applying electrical connecting elements 4 between the semiconductor chip 3 and the conductor structure 5. In this case, firstly a conventional bonding of the bonding wires 11 is performed at room temperature on the contact areas 17 of the active upper side 15 of the semiconductor chip 3, while the free ends 13 of the bonding wires 11 are initially arranged such that they are freely suspended over contact terminal areas 7.

In renewed heating-up of the components illustrated in FIG. 6 to a pre-heating temperature of the filled coating 8, these can again be brought into a highly viscous state and the prepared bonding ends 13 can be pressed into the conducting, highly viscous plastic coating. This may be carried out simultaneously for a multiplicity of bonding wires of a semiconductor chip, so that production can be rationalized in this way. In the embodiment illustrated here, two bonding wires 11 end on a common contact terminal area 7, in order to permit an increased power supply to the semiconductor chip 3.

Figure 7:
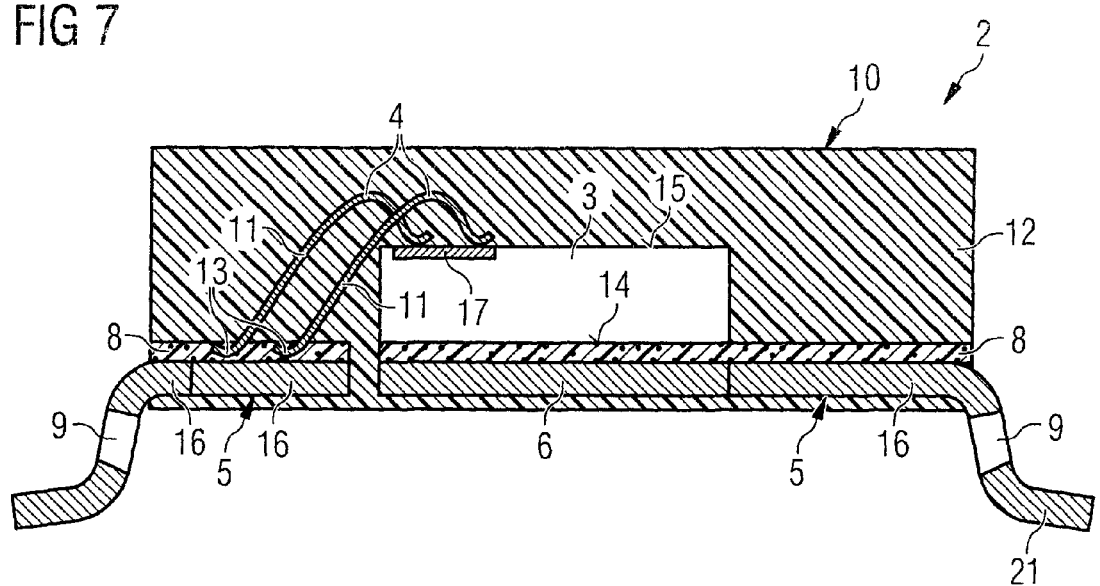

FIG. 7 illustrates a schematic cross section through a partial region of the leadframe 18 according to FIG. 6 after packaging the semiconductor device components in a plastic package molding compound 12. In this case, the components of the semiconductor device 2 are again heated up to an increased temperature, namely the temperature of the molding process, so that on the one hand the crosslinkage of the polymer chain molecules of the plastic film progresses further and on the other hand the molding compound has the possibility of completely embedding the semiconductor device components, apart from the external leads 9, in the plastic package molding compound 12 in an injection mold. Since the molding operation is extremely short, as already explained in respect of FIG. 2, complete curing through, both of the plastic package molding compound and of the filled plastic film, which has in the meantime become a filled plastic coating, may be achieved by post-curing for a longer time at an increased temperature of for example 180° C., as the example according to FIG. 2 illustrates.

Figure 8:
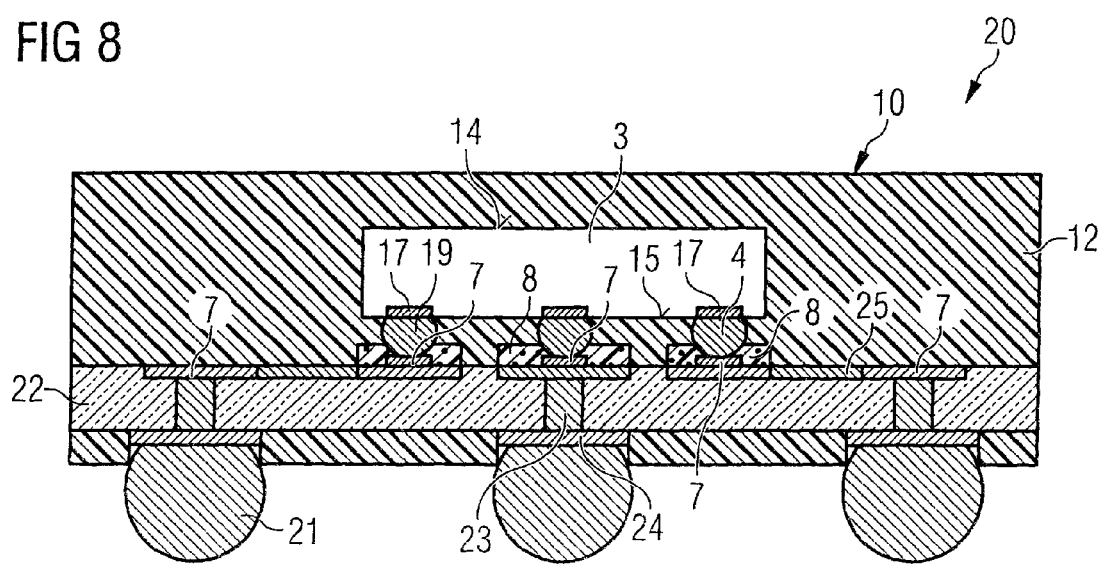
FIG. 8 illustrates a schematic cross section through a semiconductor device of a third embodiment of the invention.

FIG. 8 illustrates a schematic cross section through a semiconductor device 20 of a third embodiment of the invention. Components with the same functions as in the previous figures are identified by the same designations and are not separately explained.

The third embodiment of the invention of a semiconductor device 20 according to FIG. 8 differs from the first two embodiments, according to FIG. 1 and FIG. 2, in that the semiconductor chip 3 is not arranged with its back side on a filled plastic film 8 in the plastic package molding compound 12, but rather is completely surrounded by the plastic package molding compound 12. In this embodiment of the invention, the active upper side 15 of the semiconductor chip has flip-chip contacts 19 as connecting elements 4 with electrically conducting particles of the filled plastic film 8. This plastic film 8, filled with electrically conducting particles, merely covers contact terminal areas 7 of a wiring substrate 25, so that in the production of this semiconductor device the semiconductor chip 3 can be pressed with its flip-chip contacts 19 into the highly viscous compound of the filled plastic film 8 after heating the support substrate 22 with the contact terminal areas 7 and regions of the filled plastic film 8, without an additional soldering process being required. This simplifies the production of such a semiconductor device.

The selective application of regions of a filled plastic film 8 can be carried out in the same way as in the case of the first embodiments of the invention. In the third embodiment of the invention, a support substrate 22 with a ceramic sheet is formed instead of a conductor structure having leads. Contact vias 23 through the ceramic sheet ensure that external contacts 21 which are larger in their dimensions by approximately an order of magnitude than the electrical connecting elements 4 in the form of flip-chip contacts 19 can be arranged on the underside of the ceramic sheet. These external contacts 21 in the form of solder balls are attached to external contact areas 24, which are in connection by way of the contact vias 23 with the contact terminal areas 7 of the support substrate and are electrically connected by way of the wiring structure 25 to the flip-chip contacts over regions of the filled plastic film 8.

With this third embodiment of the invention it is illustrated that the plastic film filled with electrical particles can be used in a wide range of different variations in semiconductor technology and in the production of semiconductor devices to shorten the process sequence. It is also possible in FIG. 8, in a way not illustrated here, for between the support substrate 22 and the plastic package molding compound 12 to be covered with a filled plastic film 8, in order to improve the adhesiveness of the plastic package molding compound 12 with respect to the support substrate 22. However, in order to avoid short-circuits, a filled plastic film 8 with insulating ceramic particles is used for this function.

The invention claimed is:

1. An integrated circuit comprising:
   a semiconductor chip;
   a conductor structure having a chip island and internal leads coplanar with the chip island, the internal leads including contact terminal areas; and
   a filled plastic film coating the entire conductor structure including the chip island and the internal leads, except for the contact terminal areas, where a bottom surface of the semiconductor chip is mechanically fixed and electrically coupled to the chip island by the filled plastic film and contact areas on a top surface of the semiconductor chip are electrically connected to the contact terminal areas by bonding wires; and
   a plastic packaging molding compound encasing the semiconductor chip, the bonding wires, and internal leads, wherein the filled plastic film on the internal leads promotes adhesion of the plastic packaging molding compound to the conductor structure, wherein the filled plastic film coats areas of the conductor structure beyond an area at which the semiconductor chip is fixed and extends to outside surfaces of the plastic packaging molding compound, and wherein the plastic film has as the filler conductive metal particles.

2. The circuit as claimed in claim 1, comprising wherein the semiconductor chip is integrally fixed on the chip island by way of the plastic film with leads of a package by a leadframe technique.

3. A semiconductor device comprising:
   a semiconductor chip;
   a conductor structure having a chip island and internal leads with contact terminal areas, which are arranged in a coplanar manner, the chip island and the internal leads, except for the contact terminal areas of the internal leads, coated by a filled plastic film, the semiconductor chip being mechanically fixed and electrically connected by the filled plastic to the chip island, wherein electrical connecting elements connect the semiconductor chip to the contact terminal areas, and wherein the filled plastic film on the internal leads represents an adhesion-promoting coating with respect to a surrounding plastic package molding compound, and wherein the filled plastic film coats areas of the conductor structure beyond an area at which the semiconductor chip is fixed and extends to outside surfaces of the plastic package molding compound, and wherein the plastic film has as the filler conductive metal particles.

4. The semiconductor device as claimed in claim 3, comprising wherein the semiconductor chip is integrally fixed on the chip island by way of the plastic film with leads of a package by a leadframe technique.

5. An integrated circuit comprising:
   a semiconductor chip;
   a conductor structure having a chip island and internal leads with contact terminal areas; and
   filled plastic film means coating the chip island and the internal leads, except for the contact terminal areas, where the semiconductor chip is mechanically fixed and electrically coupled by the film to the chip island and electrically connected to the contact terminal areas by electrical connecting elements, the filled plastic film means on the internal leads represents an adhesion-promoting coating with respect to a surrounding plastic package molding compound, wherein the filled plastic film means coats areas of the conductor structure beyond an area at which the semiconductor chip is fixed and extends to outside surfaces of the plastic packaging molding compound, and wherein the plastic film has as the filler conductive metal particles.

\* \* \* \* \*